US011716068B1

(12) United States Patent
Tsironis

(10) Patent No.: US 11,716,068 B1
(45) Date of Patent: Aug. 1, 2023

(54) VERY LOW FREQUENCY IMPEDANCE TUNER

(71) Applicant: Christos Tsironis, Dollard-des-Ormeaux (CA)

(72) Inventor: Christos Tsironis, Kirkland (CA)

( * ) Notice: Subject to any disclaimer, the term of this patent is extended or adjusted under 35 U.S.C. 154(b) by 47 days.

(21) Appl. No.: 17/526,027

(22) Filed: Nov. 15, 2021

(51) Int. Cl.
| | | |
|---|---|---|
| *H03H 7/40* | (2006.01) | |
| *H01G 5/06* | (2006.01) | |
| *G01R 31/319* | (2006.01) | |
| *G01R 27/32* | (2006.01) | |
| *H01G 5/013* | (2006.01) | |

(52) U.S. Cl.
CPC ............... *H03H 7/40* (2013.01); *G01R 27/32* (2013.01); *G01R 31/31905* (2013.01); *H01G 5/0132* (2013.01); *H01G 5/06* (2013.01)

(58) Field of Classification Search
CPC . H03H 7/40; H03H 7/38; G01R 27/32; G01R 27/28; G01R 31/31905; G01R 31/319; H01G 5/00; H01G 5/01; H01G 5/011; H01G 5/012; H01G 5/013; H01G 5/0132; H01G 5/38; H01G 5/014; H01G 5/019; H01G 2005/02
See application file for complete search history.

(56) References Cited

U.S. PATENT DOCUMENTS

| | | |
|---|---|---|
| 7,646,267 B1 | 1/2010 | Tsironis |
| 8,912,861 B1 | 12/2014 | Tsironis |
| 9,893,717 B1 * | 2/2018 | Tsironis ................. H01G 5/019 |
| 10,290,428 B1 * | 5/2019 | Tsironis ................. H01G 5/014 |
| 10,804,872 B1 * | 10/2020 | Tsironis .................. H03H 7/38 |

OTHER PUBLICATIONS

"Load Pull Measurements" [online], Wikipedia [retrieved on Nov. 18, 2016] Retrieved from Internet <URL:http://en.wikipedia.org/wiki/Load_pull>.
"Computer Controlled Microwave Tuner—CCMT", Product Note 41, Focus Microwaves Jan. 1998.
"Variable capacitor" [online], Wikipedia [retrieved on Nov. 3, 2021] Retrieved from Internet <URL: https://en.wikipedia.org/wiki/Variable_capacitor>.
"Search algorithm" [online]. Wikipedia [retrieved on Oct. 7, 2021] Retrieved from Internet <URL: <https://en.wikipedia.org/wiki/Search_algorithm>.

* cited by examiner

*Primary Examiner* — Stephen E. Jones

(57) ABSTRACT

A low radio frequency electro-mechanical load pull impedance tuner uses four rotary, remotely controlled variable shunt capacitors and three fixed series transmission lines to create up to $10^8$ independently controllable impedance states at each frequency covering the entire Smith chart in the frequency range between 1 and 10 MHz; the capacitors and control motors and gear are immersed in high epsilon dielectric fluid inside individual sealed containers. Appropriate Error Function-based optimization algorithms, allow fast impedance tuning at the fundamental frequency at the output of DUT's operated in high gain compression. Stepper motors, drivers and control software are used to remotely control the variable shunt capacitors of the tuner and allow it to be automated, pre-calibrated and used in an automated load pull measuring setup.

5 Claims, 13 Drawing Sheets

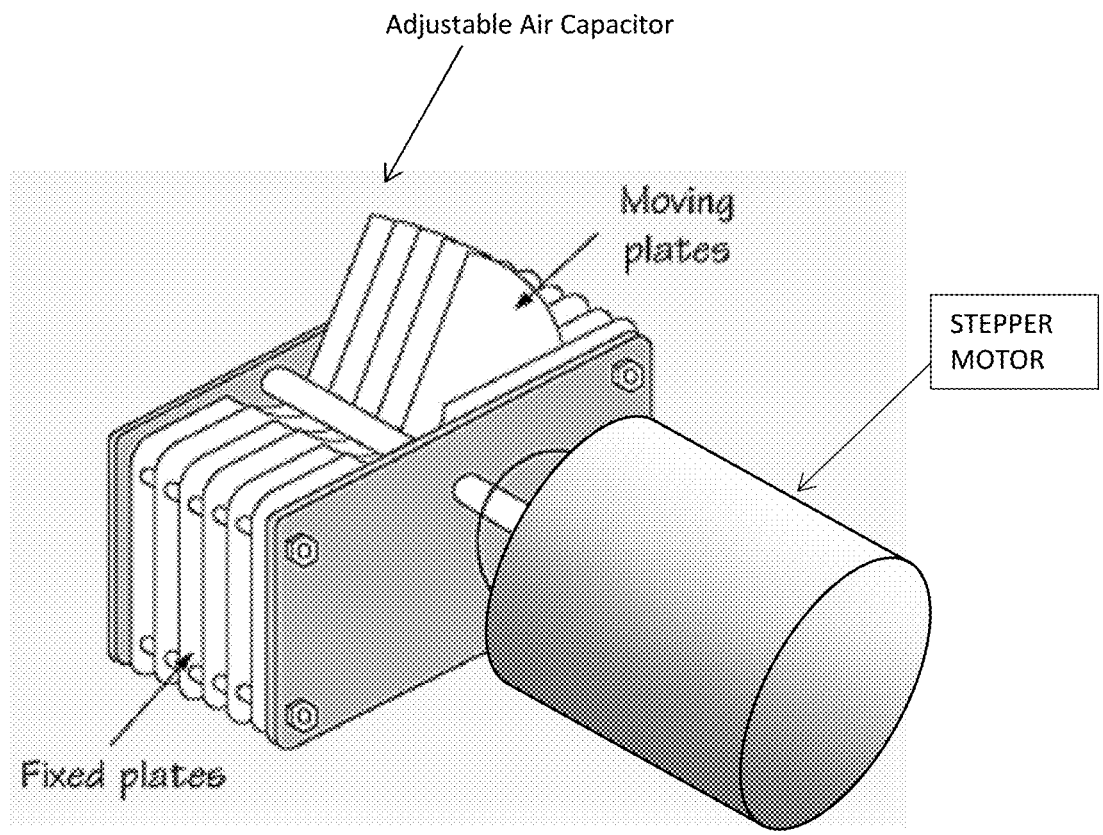
FIG. 4: Prior art

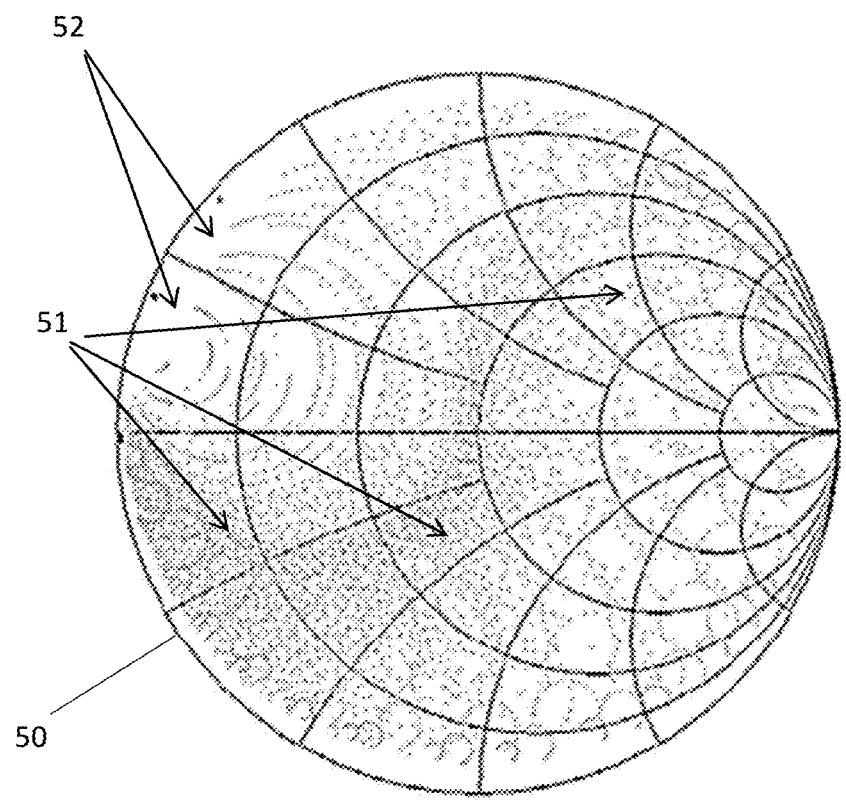
FIG. 5: Prior art

FIG. 6A: Prior art
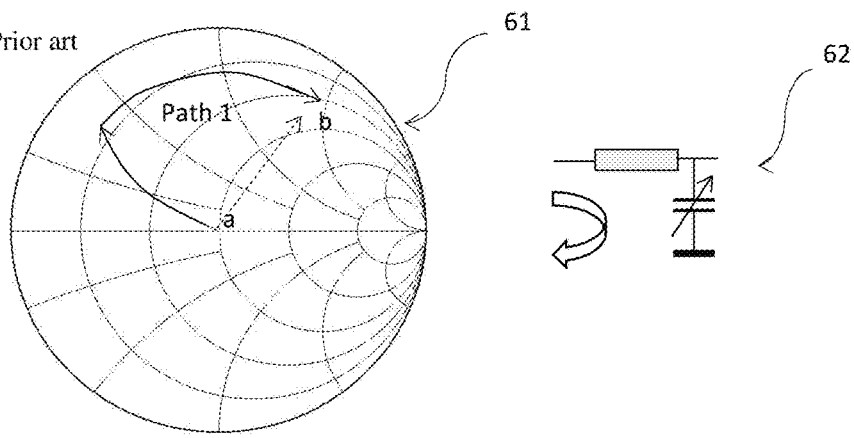
FIG. 6B: Prior art
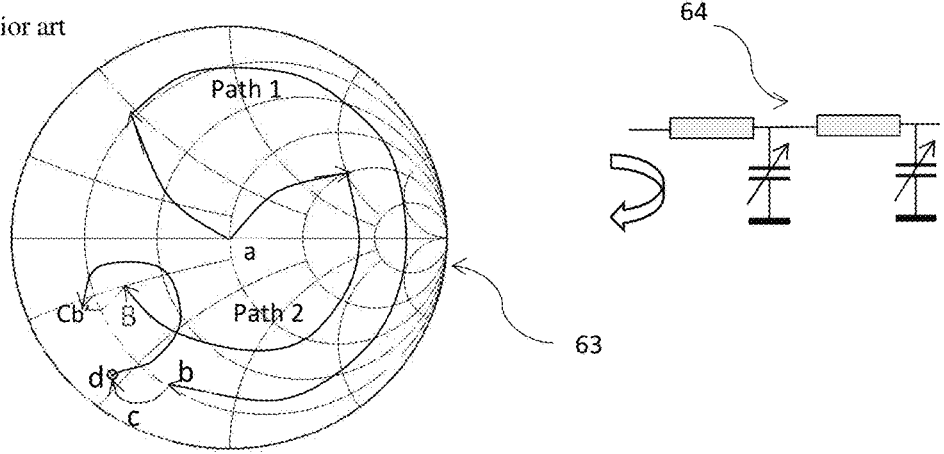
FIG. 6C: Prior art
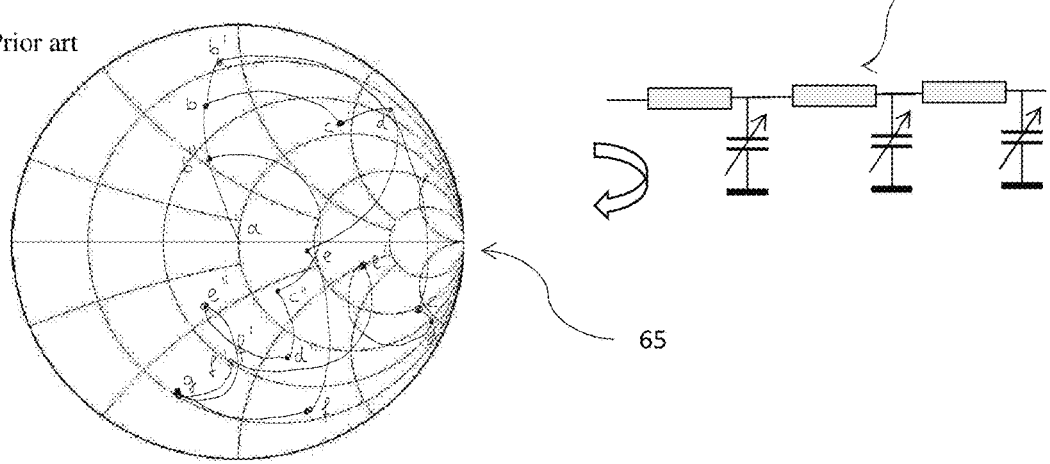

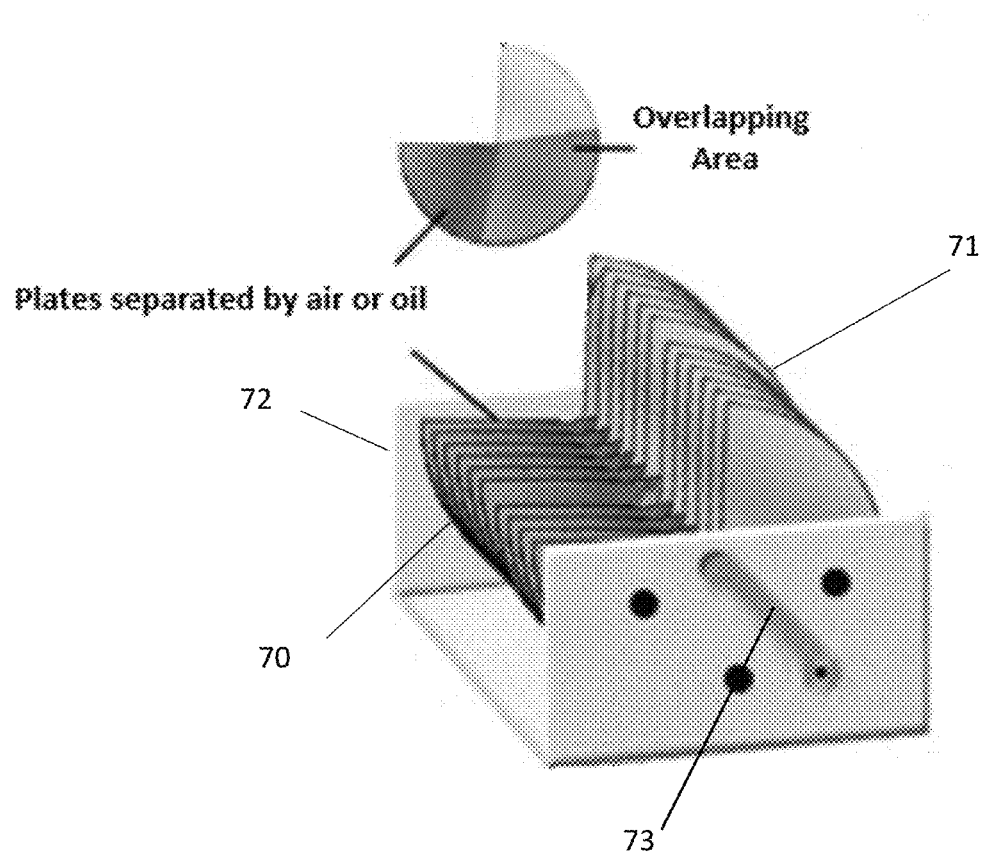
FIG. 7: Prior art

VERY LOW FREQUENCY IMPEDANCE TUNER

PRIORITY CLAIM

Not Applicable

CROSS-REFERENCE TO RELATED ARTICLES

1. "Load Pull Measurements" [online], Wikipedia [retrieved on Nov. 18, 2016] Retrieved from Internet <URL:http://en.wikipedia.org/wiki/Load_pull>.
2. "Computer Controlled Microwave Tuner—CCMT", Product Note 41, Focus Microwaves, January 1998.
3. Tsironis, C., U.S. Pat. No. 7,646,267, "Low frequency electro-mechanical impedance tuner".
4. "Variable capacitor" [online], Wikipedia [retrieved on Nov. 3, 2021] Retrieved from Internet <URL: https://en.wikipedia.org/wiki/Variable_capacitor>.
5. "Search algorithm" [online]. Wikipedia [retrieved on Oct. 7, 2021] Retrieved from Internet <URL: <https://en.wikipedia.org/wiki/Search_algorithm>.
6. Tsironis, C., U.S. Pat. No. 8,912,861, "Mechanically controlled variable capacitors for impedance tuners".

BACKGROUND OF THE INVENTION AND PRIOR ART

This invention relates to load pull testing of transistors and amplifiers at very low RF frequencies under high power operating conditions, using automatic impedance tuners used to synthesize impedances at the input and output of the test devices (DUT).

Accurate design of high-power amplifiers, oscillators and other active components used in various communication systems require accurate knowledge of the active device's (RF transistor's) characteristics under high power operation conditions. In such circuits, it is insufficient and not accurate enough to describe transistors, operating at high power in their highly non-linear regions close to saturation, using analytical or numerical models only. Instead, the transistors need to be characterized using specialized test setups under the actual operating conditions.

A popular method for testing and characterizing such components (transistors) under high power operation conditions is "load pull" and "source pull". Load pull (see ref. 1) or source pull are measurement techniques employing RF impedance tuners and other RF test equipment, such as RF signal sources and RF power meters. The impedance tuners are used in order to manipulate the microwave impedances presented to and under which the Device under Test (DUT, amplifier or transistor) is tested (FIG. 1).

There are essentially three types of tuners used in such test setups: a) Electro-mechanical tuners, see ref. 2, b) electronic tuners, and c) active tuners; types b) and c) are of no concern in our case. Electro-mechanical tuners have several advantages compared to electronic and active tuners, such as long-term stability, higher handling of microwave power, easier operation and lower cost. These tuners are either based on controlling rotary variable capacitors for frequencies below 100 MHz (see ref. 4), or using the slide-screw concept of approaching a grounded conductive tuning probe (slug) to the center conductor of a transmission line for frequencies above 100 MHz and up to 120 GHz (see ref. 2). In this type of tuner semi-cylindrically bottomed RF probe (slug) is inserted into the slot of a slotted transmission airline and allows reflecting part of the power coming out of the DUT and creating a complex reflection factor ($\Gamma$) or complex impedance (Z) that is presented to the DUT. The relation between $\Gamma$ and Z is: $Z=Zo*(1+\Gamma)/(1-\Gamma)$; where Zo is the characteristic impedance of the transmission line (slabline) in which the slug is inserted.

There are two major obstacles for making such electro-mechanical slide screw tuners working at radio frequencies below 100 MHz: One is the limited achievable capacitance between the RF probe and the central conductor (see ref. 2) and the other is the required length of the transmission line of the tuner. Electromechanical slide screw tuners need to be at least one half of a wavelength ($\lambda$/2) long, in order to be able to create a phase rotation by at least 360° in order to synthesize reflection factors $\Gamma$ covering the entire Smith Chart. At a frequency of 1 GHz this corresponds to a length of 15 cm, at 100 MHz this becomes 1.5 meters and at 10 MHz it becomes 15 meters. It is obvious that it is practically impossible to manufacture precise slotted airlines (slablines) bigger than 1.5 to 2 meters and use them in a RF laboratory environment. Or the minimum realistic frequency for slide screw tuners is 100 MHz.

A new low frequency tuner topology has been introduced in ref. 3. In this case three mechanically variable air capacitors (see ref. 4) are used, which are separated by specific lengths of coaxial RF cable. This compact configuration allows tuning over a certain frequency range of reflection factors. This tuner uses fixed lengths of semi-rigid cable in coil form in series between shunt capacitors and has, therefore limited frequency bandwidth up to one octave. The limited maximum capacitance of rotating air capacitors of around 1500-2000 pF on the other hand restricts tuning towards low frequencies to 10 MHz. To create 1-2 MHz tuners capacitances between 12,000 and 30,000 pF are needed. Assuming 10 settings of each capacitor, between minimum value and maximum value, the total number of states will be 1000. Because the length of cables between capacitors is fixed the phase of the reflection factors cannot be rotated. This limits the tuning range at frequencies close to the one for which the transmission line lengths have been optimized (see ref. 5).

A new tuner structure is described here which uses four sets of capacitors and transmission lines to increase the tuning frequency coverage and high value rotating air capacitors submerged to high epsilon dielectric to reduce the minimum frequency of operation.

BRIEF DESCRIPTION OF THE INVENTION

The new tuner employs four transmission line-capacitor tuning modules to increase the frequency (F) range coverage. It also employs dielectric oil-submerged capacitors to increase the maximum capacitance value and create low enough capacitive reactance ($1/\omega C$) to generate high enough reflection $|S11|=(1-\omega C/Yo)/(1+\omega C/Yo)$, where Yo=20 mS and $\omega=2\pi*F$; when F decreases, C must increase to increase the controllable ratio $\omega C/Yo \gg 1$ even at very low frequencies F; at F=1 MHz the capacitance needed to obtain S11=0 or Y=20 mS is C=160 pF; to obtain S11=0.95 the capacitance needed is C=8,100 pF, in which case $\omega C$=0.51 mS; ordinary low cost rotary air capacitors cannot do that. Therefore, the proposed solution includes stepper motor remotely controlled rotary air capacitors entirely submerged in high epsilon ($\varepsilon r$) low loss dielectric fluid, like mineral ($\varepsilon_r \approx 2.1$) or castor ($\varepsilon_r \approx 5$) oil. An additional benefit of this solution is the increased breakdown voltage between the rotating capacitor plates 70, 71 (see FIG. 7) and thus increased RF power handling.

Introducing liquids in a RF measurement instrumentation is unusual. Leakage must be eliminated and long-term effects minimized. The solution adopted in this case includes a sealed container, which includes the rotary capacitor itself, the stepper motor, a limit switch for capacitor initial setting reference and DC and RF cable plugs (FIG. 11). The container is non-metallic in order to minimize fringe capacitors bypassing the controllable portion of the capacitance or metallic to eliminate interferences (in case of low noise measurements).

BRIEF DESCRIPTION OF THE SEVERAL VIEWS OF THE DRAWINGS

The invention and its mode of operation will be more clearly understood from the following detailed description when read with the appended drawings in which:

FIG. 4 depicts prior art: variable commercially available air capacitors controlled by stepper motors; the single section capacitor and is preferably used for higher frequencies F>60 MHz; a triple section capacitor and is preferably used for the lower frequencies F<60 MHz.

FIG. 5 depicts prior art: the distribution of 1000 calibration points of load pull tuner shown at one given frequency (here Fo=40 MHz).

FIGS. 6A through 6C depict prior art: Various tuning paths when using slide screw tuners: FIG. 6A depicts tuning using a single line-capacitor module; FIG. 6B depicts tuning using two line-capacitor modules; more than one tuning path are possible; FIG. 6C depicts tuning using three line-capacitor modules: a multitude of tuning paths leads from point a to point g are possible.

FIG. 7 depicts prior art: the 3D view and operation of a rotating air capacitor.

DETAILED DESCRIPTION OF THE INVENTION

Figure 1:
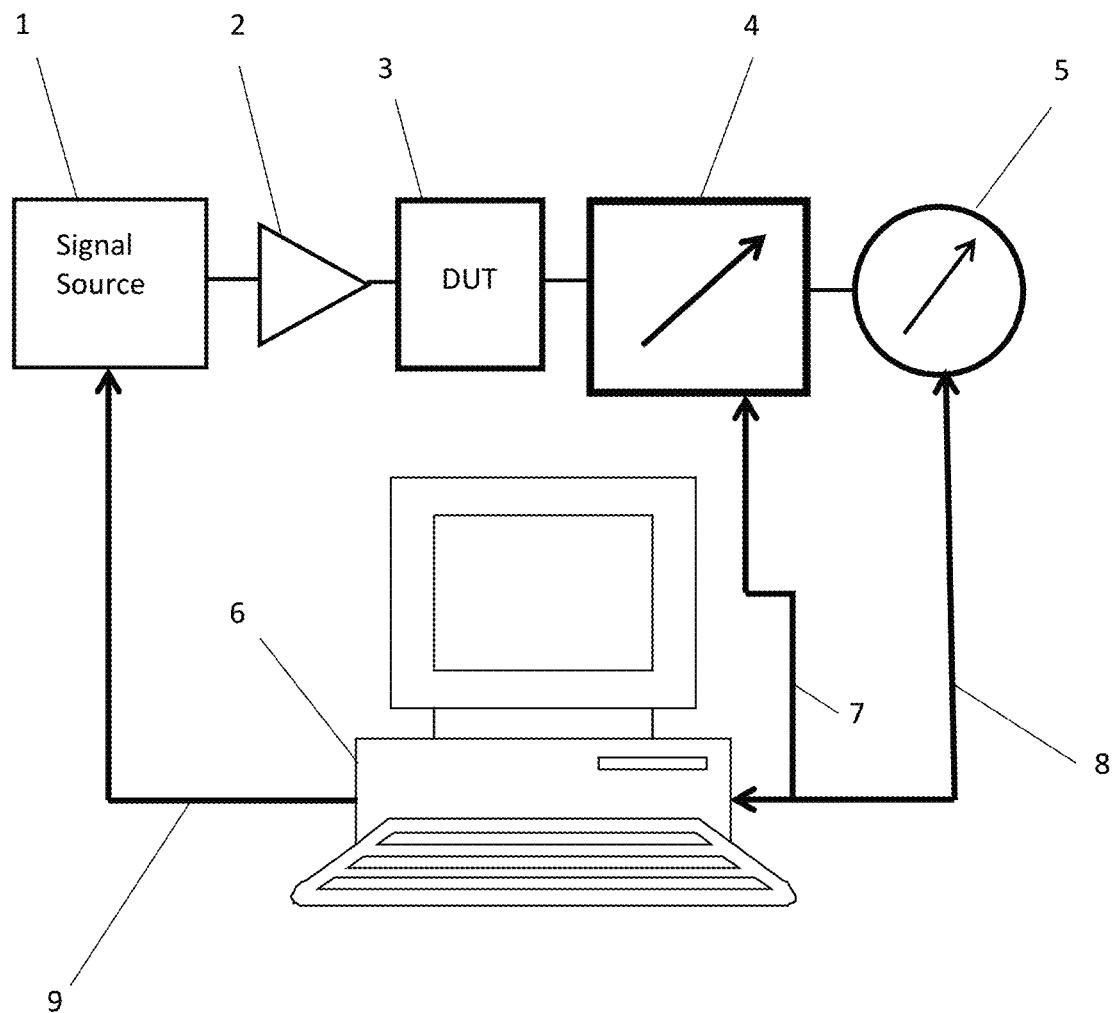
FIG. 1 depicts prior art, a load pull measurement system using wideband tuners and associated instruments. A wideband tuner can also be used at the source side of the DUT to extend the setup.
Figure 2:
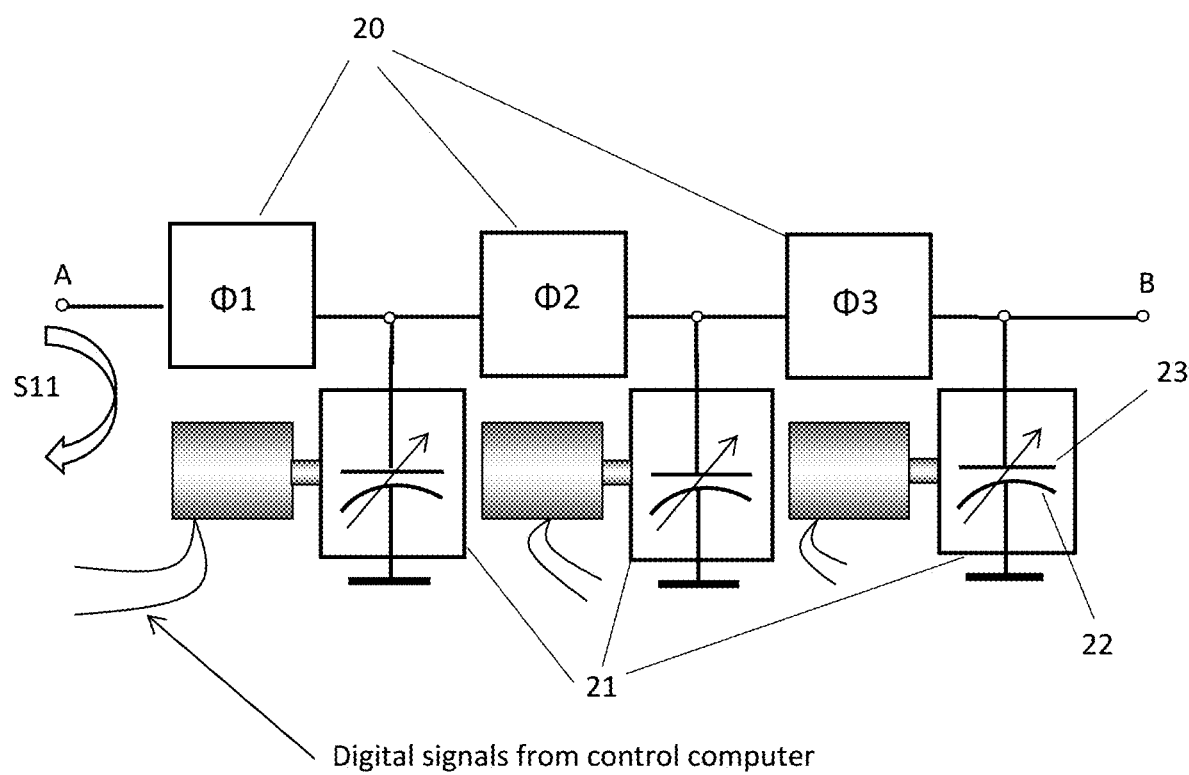
FIG. 2 depicts prior art, a three "transmission line-capacitor" module low frequency tuner.

A typical load pull measurement system is shown in FIG. 1: it includes a signal source 1, a driver amplifier 2, the device under test (DUT) 3 in an appropriate test fixture, a load impedance tuner 4 and a signal receiver or power meter 5; the tuner is controlled by a digital cable 7 and the instruments similarly 8, 9 by a system computer 6. The tuner 4 creates user-defined load to the DUT of which the RF and DC behavior is registered by the controller 6 via the receiver 5 and used to create ISO contours on the Smith chart; these contours allow identifying the optimum load for the specific characteristic of the DUT, this being gain, output power, efficiency etc. the tuner 4 can be replicated at the input of the DUT 3 to study also the dependence on the source impedance. The impedance tuners are available from 10 MHz to over 120 GHz. This invention presents a family of tuners covering down to 1 MHz The prior art low frequency tuner is shown in FIG. 2: it includes three transmission line 20-capacitor 21 modules (see ref. 6); the frequency coverage of this tuner is up to one octave; the phase shifters 20 (Φi) are coaxial cables of fixed length, optimized to create a maximum Smith chart reflection factor Γ=S11 coverage over the target frequency range (S11 is measured when port B is terminated with characteristic impedance Zo=50Ω); the capacitors are adjustable between a minimum residual value Cmin and a maximum Cmax. Because of the mechanical structure of air-filled capacitors, the minimum fringe capacitance is non-negligible, even if the rotating blades are completely disengaged (FIG. 7). This phenomenon must be considered in tuner calibration and tuning. The residual lead inductance to the stator and rotor blades of the rotary capacitor creates a combined series-parallel resonance network at maximum capacitance settings limiting this way the frequency range of the tuner.

Figure 3:
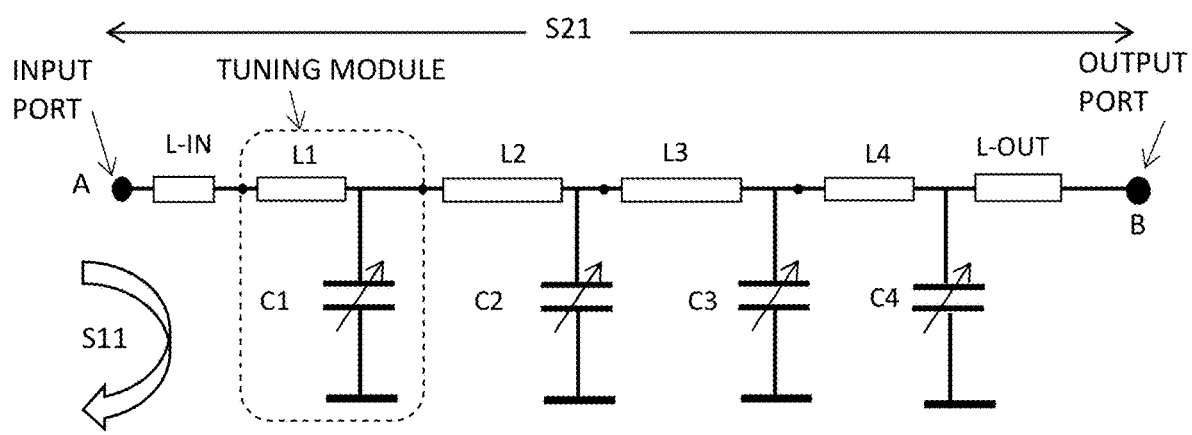
FIG. 3 depicts a four "transmission line-capacitor" module low frequency wideband tuner.

The low frequency tuner in this invention includes four transmission line-capacitor tuning modules: FIG. 3: the fixed transmission lines are L1 to L4 and the four rotary capacitors are C1 to C4; the values of L1 to L4 are selected for maximum coverage of the Smith chart of S11 for any combination of capacitor values between Cmin and Cmax. Maximum capacitance does not always mean maximum S11, it all depends on the actual configuration: the optimization algorithm uses measured capacitance data and modelled transmission lines, using the effective dielectric constant (typically Teflon) of the coaxial cable used. The search algorithm (see ref. 5) calculates S11 as a function of L1 to L4 and C1 to C4 for a target frequency range. The capacitors are measured at 10 settings between Cmin and Cmax and the transmission lines are increased in steps of 1 cm independent on each other for frequency steps of typically 1/20 of the target frequency range; for each combination of parameters a target function TF=SUM (S11(L1–L4, C1–C4)) is calculated for each frequency and normalized to the number of trials to cover the unitary circle (Smith chart). The results allow dimensioning the inter-module cable lengths and obtain a working tuner.

The remotely controlled capacitors are shown in FIG. 4; they include one (FIG. 4) or more groups of parallel blades engaged progressively by rotating the grounded axis (rotor 71, FIG. 7, also shown schematically 22 in FIG. 2). The non-rotating group of blades (stator, 23) is insulated from ground (floating) as shown schematically also in FIG. 2; the stepper motors are digitally controlled by the controller and set to given angles, as shown in FIG. 7, to control, linearly with the angle the capacitance value. The stepper motors can be linked directly to the rotor axis of the capacitors or via a belt 112 (FIG. 11) or via a reducing gear to increase the step resolution. The typical reflection factor calibration cloud 51 generated by the tuner at any given frequency inside the operation range on the Smith chart 50 is shown in FIG. 5. Depending on the individual transmission line lengths L2-L4 certain areas are densely populated and others are not. The cloud 51 includes typically $10^4$=10,000 points (for 10 settings of each capacitor); however, this is insufficient for fine tuning, especially in certain sparsely populated areas 52; therefore, the capacitor values are linearly interpolated to the maximum resolution (typically 100 steps, if using 1.8° stepper motors and no transforming gear), in which case the tuning resolution is increased to $100^4$=100,000,000 tunable points; if these points were equally distributed on the Smith chart, each distinct pixel (impedance) would be a small circle with a surface of $\pi*10^{-7}$. Even with extreme unequal point distribution, it is obvious that the specific tuning resolution is entirely sufficient for all practical purposes.

The tuning mechanisms are shown in FIG. 6A to 6C: in FIG. 6A, 61 a single capacitor 62 moves the reflection factor from point a to a given radius. The transmission line then creates path 1 and brings it to point b; this configuration creates a single radius between a and b. Two capacitors and two transmission lines (FIG. 6B) 64 generate a more complex path1-path2 combination 63 leading from a to b, c and d. Finally (FIG. 6C) three capacitors, spaced by three transmission lines 66, create a far more complex path 65 leading from a to g over several stops. A 4-capacitor, 3-transmission line structure is more confusing and needless to represent graphically. The tuning occurs purely by numerical search amongst the millions of possible configurations by optimizing an error function EF=|S11−S11.target|$^2$, wherein S11 is the calculated reflection factor and S11.target is the reflection factor to be synthesized. Modern computers manage data processing in fractions of a second, assuming the s-parameter permutations are saved in RAM.

Prior art schematics show the exact operation of the rotary capacitor (FIG. 7); it comprises a grounded shell 72 holding the axis 73 of a rotor 71 which carries a number of parallel mounted metallic semicircular disc-blades. RF continuity of the grounding of this assembly is critical and has been the subject of prior research (see ref. 6); if the grounding is intermittent, as the axis rotates, the tuning is useless. Opposite the rotating blades are the blades of the isolated stator 70. Linearly controlled overlapping of the two segments 70 and 71 allows linear control of the capacitance following the simple relation C=Co+$\varepsilon_0$*$\varepsilon_r$*A/s, where $e_0$ is the dielectric constant of dry air, $\varepsilon_r$ is the dielectric constant of the material between the blades with $\varepsilon_r$(Air)=1, A is the area engaged, Co is the fringe capacitance and s the space between the blades. Using dielectric constant with $\varepsilon_r$>1 increases both the maximum capacitance Cmax and the fringe capacitance Co. Reducing the space s reduces also the breakdown (spark) voltage and therefore the maximum power handling of the tuner. Using high $\varepsilon_r$ dielectric (preferably fluid) increases both C and decreases the electric field E=V/$\varepsilon_r$, where V is the voltage between the blades, proportionally, increasing this way the power handling. Potential problems in using high $\varepsilon_r$ dielectric liquid creates risks of leakage and reducing the series/parallel resonance frequency Fr~1/sqrt(Lo*Co) by increasing the zero capacitance, given the fact that any fringe lead inductances Lo remain constant.

Figure 8:
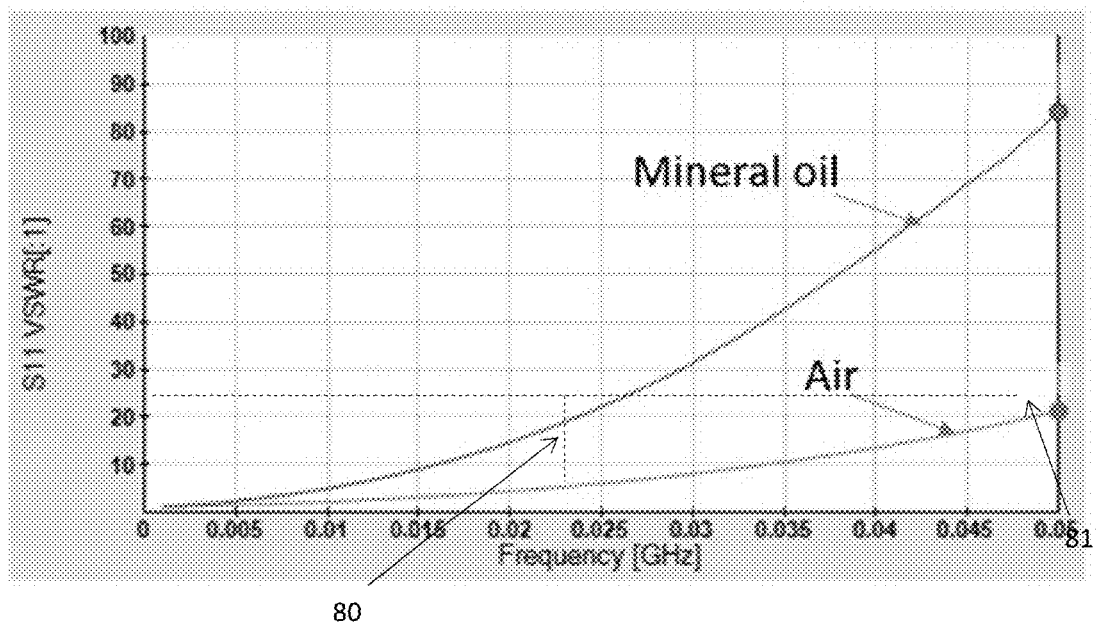
FIG. 8 depicts frequency dependence of mid value reflection factor VSWR=(1+|S11|)/(1−|S11|) of a line-air capacitor module versus a transmission line-mineral oil filled capacitor module.
Figure 9:
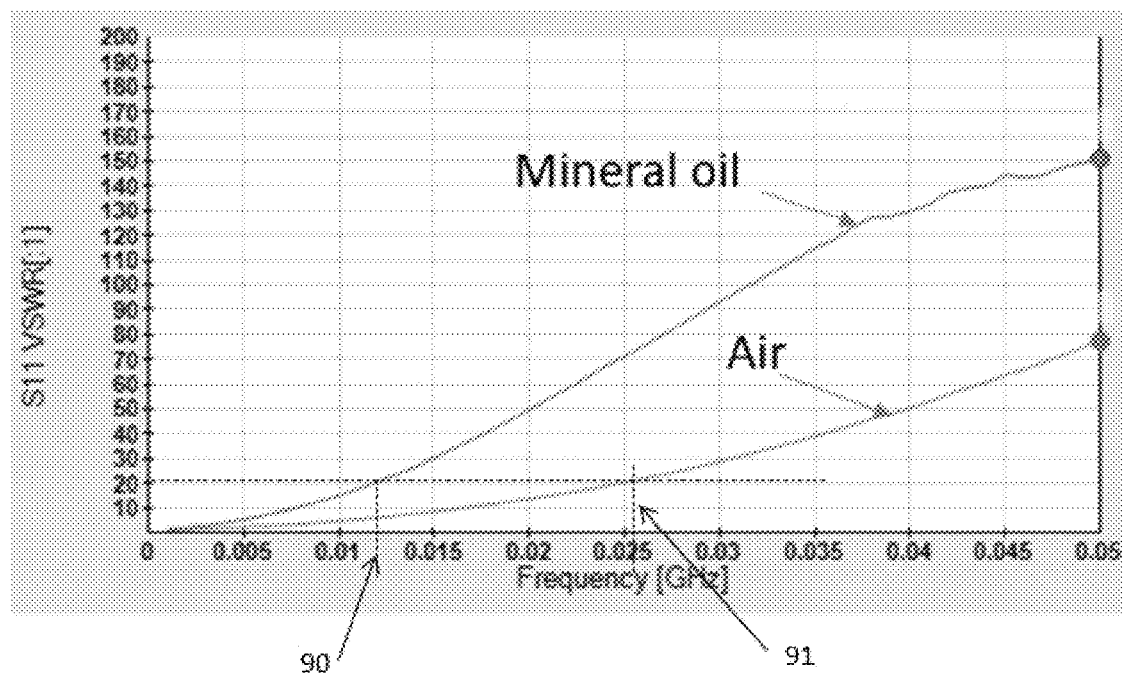
FIG. 9 depicts frequency dependence of maximum value reflection factor VSWR=(1+|S11|)/(1−|S11|) of a line-air capacitor module versus a transmission line-mineral oil filled capacitor module.
Figure 12:
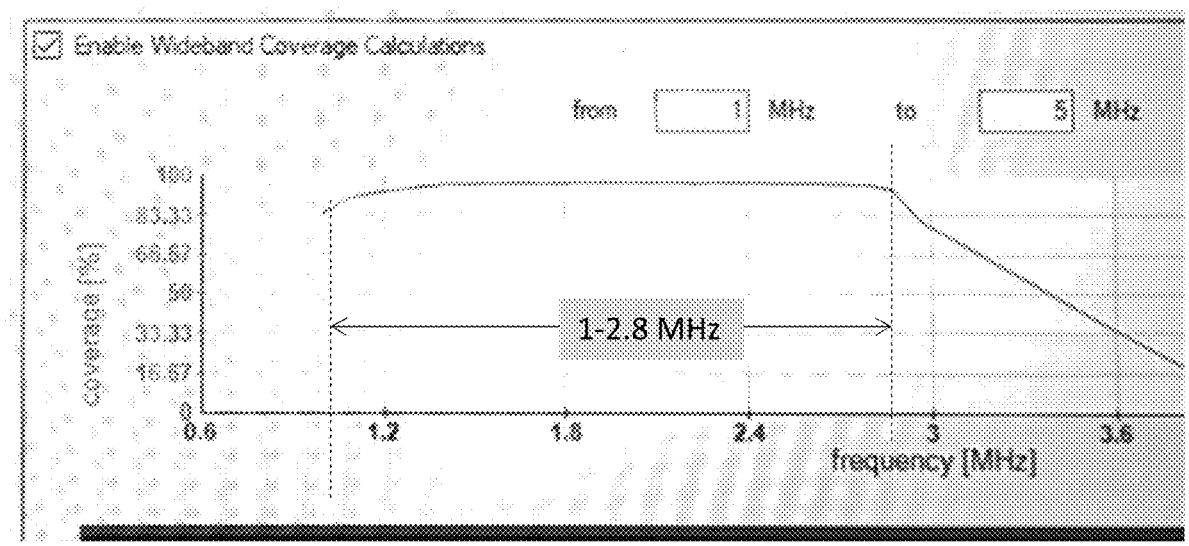
FIG. 12 depicts optimization chart showing expected Smith cart coverage over frequency after optimizing the transmission line lengths.
Figure 13:
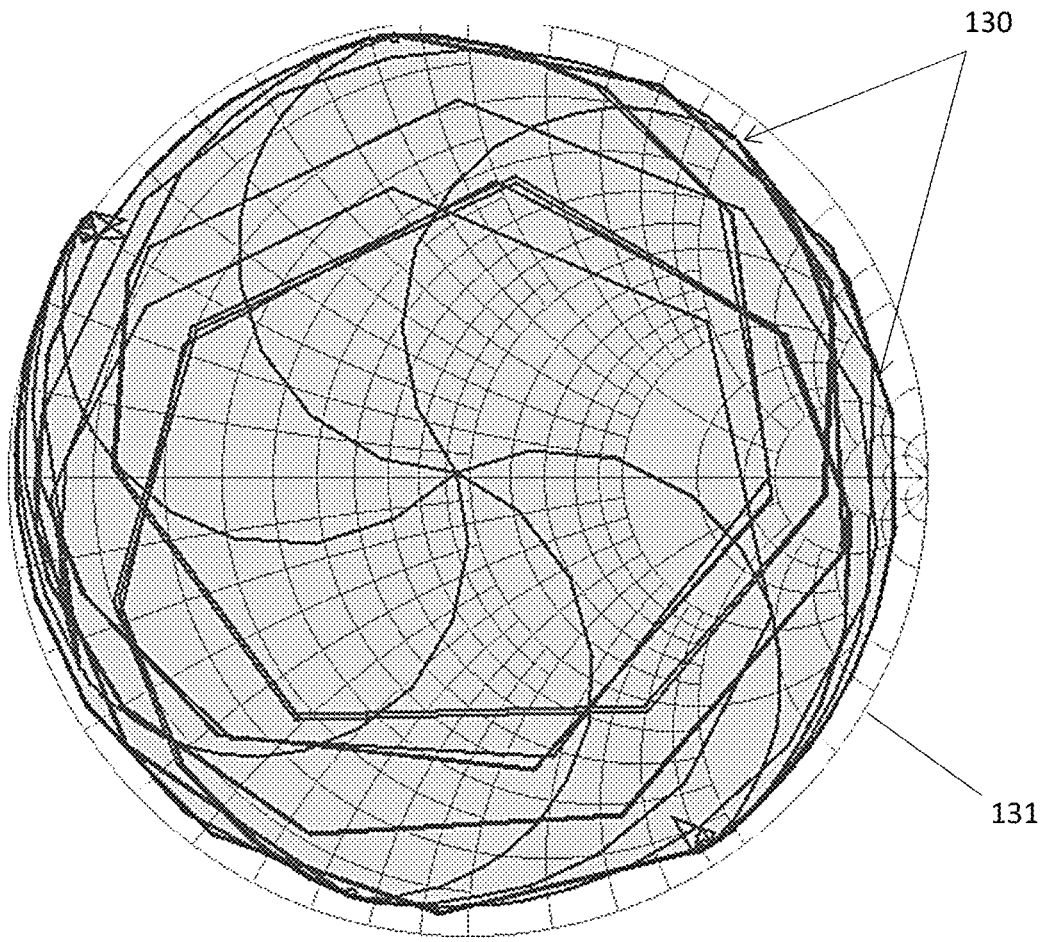
FIG. 13 depicts Smith chart coverage at a given frequency inside the optimized frequency band. The shadowed area can be reached by simply adjusting the capacitors.

In order to cover the Smith chart with adequate reflection factor>0.95, each transmission line-capacitor tuning module must create high enough reflection VSWR=(1+|S11|)/(1−|S11|); the critical value, considering unavoidable connection and insertion losses s VSWR=20:1; as shown in FIGS. 8 and 9, when using air as dielectric this is not feasible at medium capacitance setting 81 below 50 MHz and even at maximum capacitance setting 91 below 26 MHz; when using mineral oil as dielectric the critical value of VSWR=20:1 can be reached at 24 MHz: 80 and at high capacitance setting at 12 MHz: 90; in conclusion both higher capacitor values and higher dielectric are needed to reach minimum frequencies Fmin of 1 MHz. This has been achieved using air capacitances of 1600 pF immersed in Castor oil ($\varepsilon_r$≈5) as dielectric (FIGS. 12 and 13). Whereas FIG. 12 shows the maximum Smith chart coverage (in %) over frequency, in FIG. 13 the shadowed area 130 shows the actual distribution on the chart 131 itself.

Figure 11:
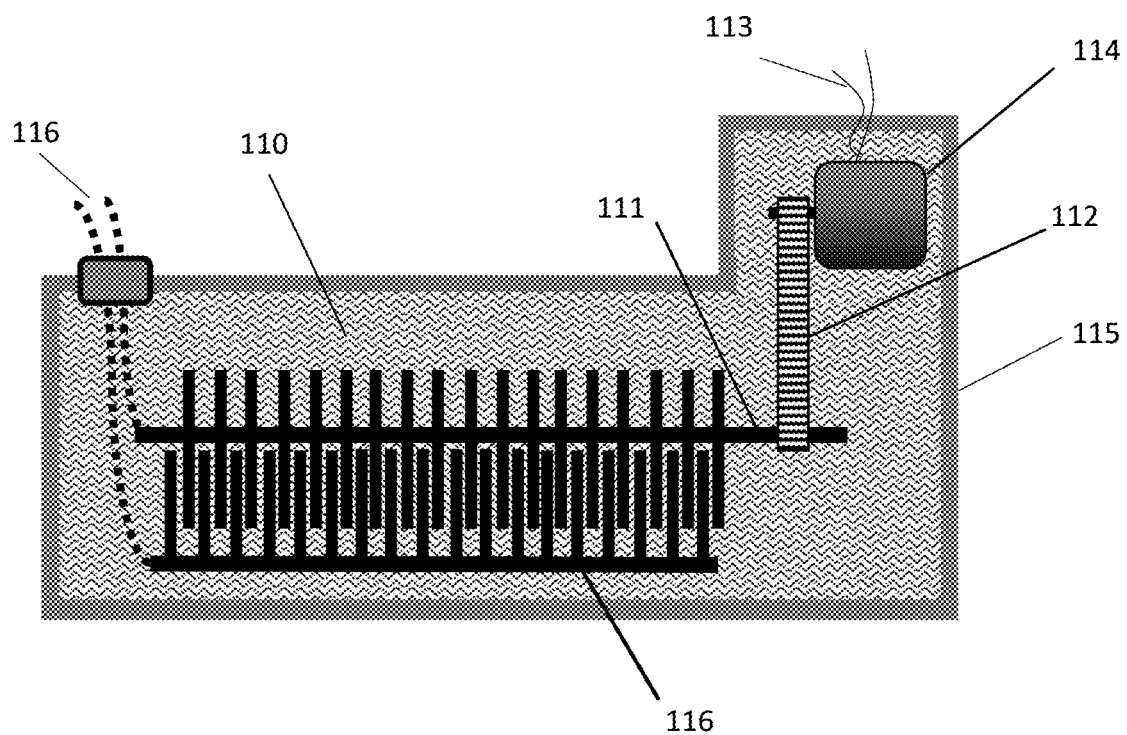
FIG. 11 depicts schematic top view of sealed container holding an oil-submerged rotary capacitor including stepper motor control.

FIG. 11 shows the top view of the layout of the capacitor container 115 holding the liquid dielectric 110, the rotary capacitor 111, 116, the stepper motor 114, which is remotely controlled 113 and drives the axis 111 of the rotor using a belt 112. The grounded and floating terminals 116 of the capacitor are guided outside using a sealed plug. The stepper motor is immersed in the dielectric fluid in order to avoid mechanical moving parts traversing the container wall and causing risk of leakage. For high power applications the container 115 itself is made of non-metallic material to minimize fringe capacitances between the capacitor blades and the housing when using high epsilon dielectric liquid, or, for measuring very low power noise figure and noise parameters of the DUT the tuning modules should be shielded from electro-magnetic interferences by making the container from metal or metallically coated plastic.

Figure 10:
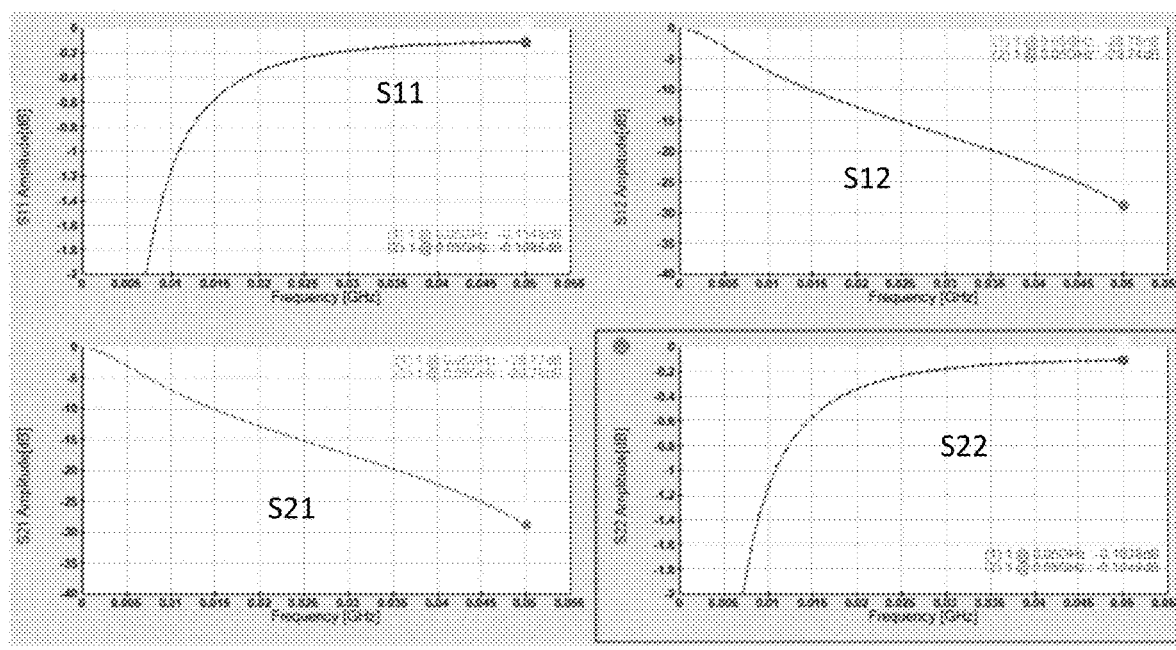
FIG. 10 depicts frequency dependence of four s-parameters of a transmission line-mineral oil filled capacitor module based two-port (see FIG. 6A).

In general, every tuning module behaves like a two-port and the overall tuner as a cascade of several such twoports. S-parameters of a four stage tuner are shown in FIG. 10: the passive tuner is, of course, reciprocal (S12=S21) and the reflection factors S11 and S22 quasi identical in amplitude even though the phases are different, since the lines precede the capacitors. The actual loss of a tuner is calculated from (1−|S11|$^2$)/|S21|$^2$. The specific tuner has (at 20 MHz) |S11|=−0.35 dB=0.961 and |S21|=−13 dB=0.224, leading to 1.83 dB loss. The use of dielectric is therefore good for boosting the capacitance value to reduce the minimum frequency but introduces non-negligible loss, which may lead to heating at high power. Immersion in dielectric fluid shall therefore be used with precaution and primarily at very low frequencies between 1 and 10 MHz.

The basic concept of this invention of using capacitors with their control motors immersed entirely in high value dielectric fluid to expand the operation to low MHz frequencies can easily be adapted to other types of mechanical variable capacitors; this shall not limit the basic idea and the scope of the present invention.

What is claimed is:

1. A low radio-frequency electro-mechanical impedance tuner, comprising:
   an input port followed by an input transmission line, an output port preceded by an output transmission line, and
   at least four cascaded tuning modules inserted between the input and output transmission lines,
   wherein
   each said tuning module comprises: a series transmission line and a variable shunt capacitor controlled by a remotely controlled stepper motor,
   and wherein
   each variable shunt capacitor has a grounded terminal and a floating terminal connected to an end of the series transmission line;
   and wherein
   the variable shunt capacitors and stepper motors are immersed in dielectric fluid.

2. The low radio frequency electro-mechanical impedance tuner, as in claim 1,
   wherein
   each variable shunt capacitor with the controlling stepper motor is housed in an individual sealed container filled with dielectric fluid.

3. The low radio frequency electro-mechanical impedance tuner, as in claim 2,
   wherein
   the grounded and floating terminals of the variable shunt capacitors are connected with the associated transmission lines via sealed feedthrough plugs.

4. The low radio frequency electro-mechanical impedance tuner, as in claim 3,
   wherein
   the sealed containers are made of electrically non-conductive material.

5. The low radio frequency electro-mechanical impedance tuner, as in claim 3,
   wherein
   the sealed containers are made of metal.

* * * * *